United States Patent
Ozone

(10) Patent No.: US 7,895,586 B2
(45) Date of Patent: Feb. 22, 2011

(54) DATA FLOW GRAPH PROCESSING METHOD, RECONFIGURABLE CIRCUIT AND PROCESSING APPARATUS

(75) Inventor: Makoto Ozone, Hirakata (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 1332 days.

(21) Appl. No.: 11/155,667

(22) Filed: Jun. 20, 2005

(65) Prior Publication Data

US 2005/0283768 A1 Dec. 22, 2005

(30) Foreign Application Priority Data

Jun. 21, 2004 (JP) ............... 2004-182516

(51) Int. Cl.
*G06F 9/45* (2006.01)
*G06F 15/00* (2006.01)
(52) U.S. Cl. .............. 717/155; 717/156; 712/201
(58) Field of Classification Search .............. None
See application file for complete search history.

(56) References Cited

U.S. PATENT DOCUMENTS

| | | | | |
|---|---|---|---|---|
| 6,964,029 | B2 * | 11/2005 | Poznanovic et al. | 716/7 |
| 7,299,458 | B2 * | 11/2007 | Hammes | 717/133 |
| 2004/0088666 | A1 * | 5/2004 | Poznanovic et al. | 716/7 |
| 2004/0088685 | A1 * | 5/2004 | Poznanovic et al. | 717/140 |
| 2004/0088689 | A1 * | 5/2004 | Hammes | 717/154 |
| 2004/0088691 | A1 * | 5/2004 | Hammes et al. | 717/158 |
| 2004/0103265 | A1 * | 5/2004 | Smith | 712/15 |
| 2006/0041872 | A1 * | 2/2006 | Poznanovic et al. | 717/140 |
| 2007/0198971 | A1 * | 8/2007 | Dasu et al. | 717/140 |

FOREIGN PATENT DOCUMENTS

JP 10-256383 9/1998

OTHER PUBLICATIONS

M.P. Cardoso, "On Combining Temporal Partitioning and Sharing of Functional Units in Compilation for Reconfigurable Architectures", Oct. 2003, IEEE, vol. 52, No. 10, pp. 1362-1375.*
Christophe Bobda, "Dynthesis of Dataflow Graphs fro Reconfigurable Systems using Temporal Partitioning and Temporal Placement", May 2003, University of Paderborn, pp. 1-90.*

* cited by examiner

*Primary Examiner*—Michael J Yigdall
*Assistant Examiner*—Ben C Wang
(74) *Attorney, Agent, or Firm*—Westerman, Hattori, Daniels & Adrian, LLP

(57) ABSTRACT

A data flow graph processing method divides at least one DFG generated into a plurality of sub-DFGs, in accordance with the number of logic circuits in a circuit set in a reconfigurable circuit. When the reconfigurable circuit is provided with a structure including multiple-row connections, the number of columns in the sub-DFG is configured to be equal to or fewer than the number of logic circuits per row in the reconfigurable circuit. Subsequently, the sub-DFGs are joined so as to generate a joined DFG. The number of columns in the joined DFG is also configured to be equal to or fewer than the number of columns per row in the reconfigurable circuit. The joined DFG is redivided to sizes with number of rows equal to or fewer than the number of rows in the reconfigurable circuit, so as to generate subjoined DFGs mappable into the reconfigurable circuit.

1 Claim, 14 Drawing Sheets

SUB-DFG38a

SUB-DFG38b

SUB-DFG38c

SUB-DFG38d

SUB-DFG38e

SUB-DFG38f

DATA FLOW GRAPH PROCESSING METHOD, RECONFIGURABLE CIRCUIT AND PROCESSING APPARATUS

BACKGROUND OF THE INVENTION

1. Field of the Invention

The present invention relates to a technique for processing a data flow graph necessary for configurable the operation of a reconfigurable circuit with variable functions.

2. Description of the Related Art

Recently, efforts have been made toward the development of a reconfigurable processor in which the hardware operation is changeable in accordance with a target application. In building architecture that implements a reconfigurable processor, a digital signal processor (DSP) or a field programmable gate array (FPGA) is used.

A field programmable gate array (FPGA) allows relatively flexible circuit configuration by permitting circuit data to be written after a large-scale integration (LSI) is fabricated. FPGAs are used to design dedicated hardware. An FPGA includes basic cells each comprised of a look-up table (LUT) for storing a truth table of a logic circuit and an output flip-flop and of programmable wiring resources connecting between basic cells. In an FPGA, a desired logic operation is achieved by writing data for storage in the LUT and by writing wiring data. Designing an LSI by using an FPGA, however, results in a larger mounting area and a higher cost than designing it with an application specific integrated circuit (ASIC). To address this, there has been proposed a method designed to reuse circuit configurations by dynamically reconfiguring an FPGA (see, for example, JP Hei10-256383 A).

For example, satellite broadcasting is operated by switching between different broadcast modes depending on the season. The hardware of a receiver adapted to this is built with a plurality of circuits for respective broadcast modes. A selector is used to switch between the circuits to receive in the broadcast mode selected. Therefore, the circuits for the other broadcast modes remain idle all the while. In a situation like mode switching, where normally a plurality of dedicated circuits are switchably used and an interval between switching events is relatively long, the LSI may be reconfigured instantaneously when switching between modes, instead of building a plurality of dedicated circuits. In this way, circuit configuration is simplified and versatility is enhanced. The mounting cost is reduced at the same time. Dynamically reconfigurable LSIs have been the focus of attention in the industry as a measure to meet the above-mentioned needs. Particularly, it is essential that LSIs installed in a mobile terminal such as a cell phone and a personal data assistant (PDA) be small-sized. By dynamically reconfiguring the LSI and switching between functions in accordance with the required use, the mounting area of the LSI is prevented from growing.

An FPGA is characterized by flexible circuit configuration design and versatility. Meanwhile, it needs to include a control circuit for controlling the on and off conditions occurring between a large number of switches, in order to permit connections between all basic cells. This will inherently increase the mounting area of the control circuit. Also, since a complex wiring pattern is developed for connection between basic cells, the wiring tends to be long. Moreover, the structure in which a large number of switches are connected to a single wire gives rise to a long delay. For these reasons, FPGA-based LSIs are generally used for testing and experimenting purposes only and are not suited to mass production, considering the mounting efficiency, performance and cost. Another problem is that, since configuration information needs to be transmitted to a large number of basic cells of LUT-based logic implementation, it takes a considerable period of time to configure the circuit. For this reason, an FPGA is not suitable for usage in which instantaneous switching between circuit configurations is needed.

To address these issues, studies have been made recently into an ALU array in which a plurality of units called arithmetic logic units each with multiple operating functions are provided in multiple rows. In an ALU array, process flows downward only so that wiring connecting ALUs in the horizontal direction is not necessary. This makes it possible to achieve circuit scale smaller than that achievable by FPGAs.

In an ALU array, the configuration for the operating functions of the ALU circuits and the wiring in a connection unit for connecting between front and back-end ALUs are controlled by command data so as to perform desired processes. The command data is generated from information in a data flow graph (DFG) created from a source program described in a high-level language such as C.

The size of a DFG mapped into the ALU array at a time is limited by the circuit scale of the ALU array. Therefore, a large DFG needs to be divided into a plurality of DFGs for later joining. The size of a DFG generated by joining directly affects the number of circuit configurations executed in the ALU array. Accordingly, it is preferable that the size be as small as possible.

SUMMARY OF THE INVENTION

The present invention has been done in view of the aforementioned situation and its object is to provide a technique capable of efficiently processing a data flow graph necessary to configure the operation of a reconfigurable circuit.

In order to solve the problems described above, the present invention according to one aspect provides a data flow graph processing method for processing a data flow graph necessary to configure the operation of a reconfigurable circuit provided with a plurality of sets of logic circuits with variable functions. The data flow graph processing method according to this aspect comprises: a step of generating at least one data flow graph representing dependency in execution between operations performed in sequence, based on a description of operations to be performed; a first dividing step of dividing the at least one data flow graph thus generated into a plurality of sub-data flow graphs, in accordance with the number of logic circuits in the set in the reconfigurable circuit; and a joining step of joining the plurality of sub-data flow graphs so as to generate a joined data flow graph. By dividing the data flow graph in accordance with the number of logic circuits in the set in the reconfigurable circuit, the data flow graph can be divided into appropriate sizes for later joining, even when the scale of the original data flow graph exceeds that of the reconfigurable circuit.

The data flow graph processing method according to this aspect further comprises a second dividing step of dividing the joined data flow graph so as to generate a plurality of subjoined data flow graphs such that the number of rows in the divided subjoined data flow graph is equal to fewer than the number of sets of logic circuits in the reconfigurable circuit. The second dividing step makes it possible to divide the joined data flow graph into sizes mappable into the reconfigurable circuit.

The present invention according to another aspect provides a processing apparatus provided with the function of processing a data flow graph. The processing apparatus according to this aspect comprises: a reconfigurable circuit which is provided with a plurality of sets of logic circuits with variable functions; a compile unit which generates at least one data flow graph representing dependency in execution between operations performed in sequence, based on a description of operations to be performed; a data flow graph processing unit which divides the at least one data flow graph thus generated into a plurality of sub-data flow graphs, in accordance with the number of logic circuits in the set in the reconfigurable circuit, generates a joined data flow graph by joining the plurality of sub-data flow graphs, and divides the joined data flow graph so as to generate a plurality of subjoined data flow graphs such that the number rows in the divided subjoined data flow graph is equal to or fewer than the number of sets of logic circuits in the reconfigurable circuit; and a configuration data generation unit which generates configuration data for configuring a function in the reconfigurable circuit, based on the subjoined data flow graphs.

The reconfigurable circuit may be provided with arithmetic logic circuits capable of selectively executing a plurality of types of multi-bit operations.

Arbitrary combinations of the aforementioned constituting elements, and implementations of the invention in the form of methods, apparatuses, systems, and computer programs may also be practiced as additional modes of the present invention.

DETAILED DESCRIPTION OF THE INVENTION

Figure 1:
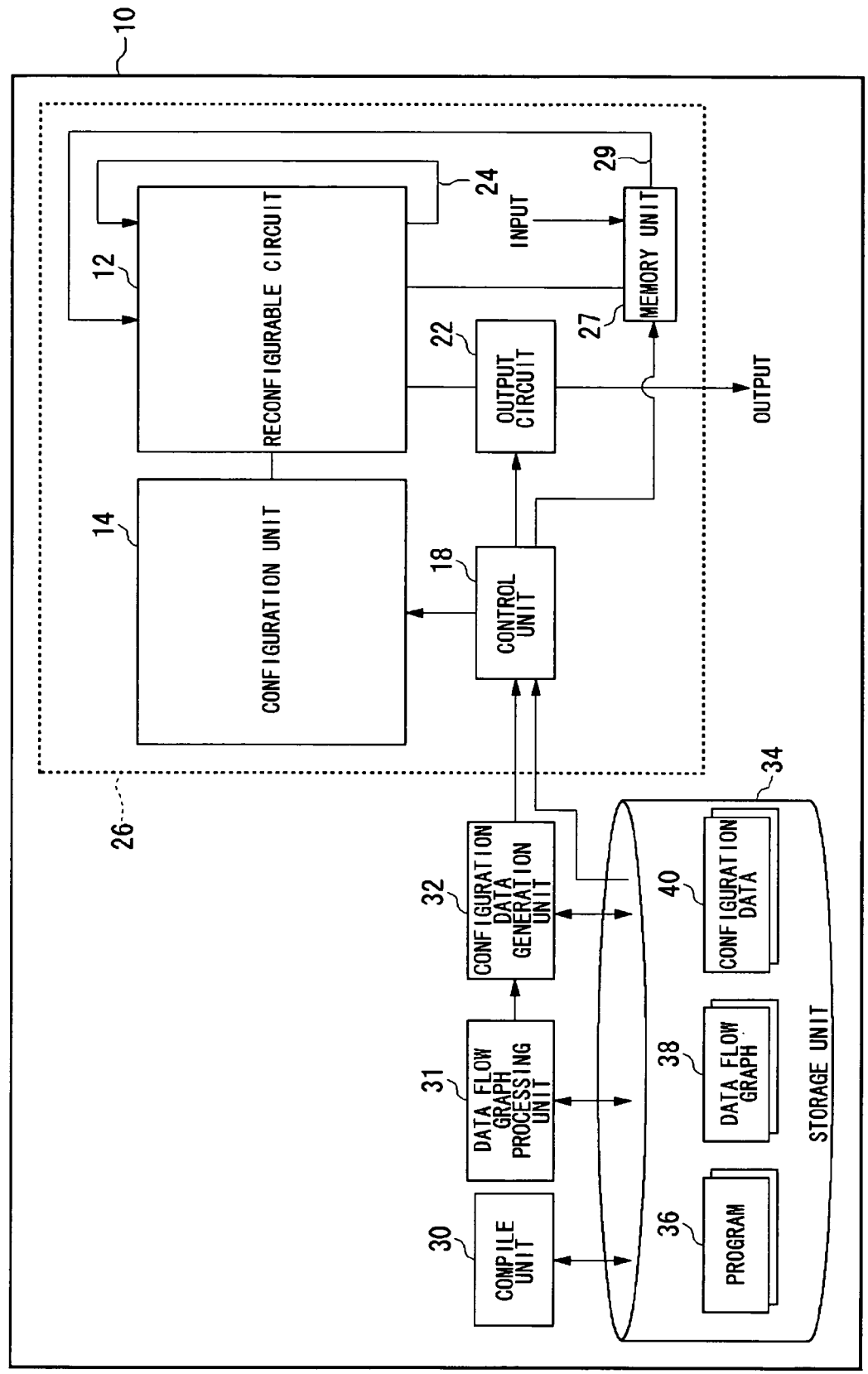
FIG. 1 illustrates the structure of a processing apparatus according to an example.

FIG. 1 illustrates the structure of a processing apparatus 10 according to an example of the present invention. The processing apparatus 10 is provided with an integrated circuit apparatus 26. The circuit configuration of the integrated circuit apparatus 26 is reconfigurable. The integrated circuit apparatus 26 is formed as a single chip and is provided with a reconfigurable circuit 12, a configuration unit 14, a control unit 18, an output circuit 22, a memory unit 27 and route units 24 and 29. The function of the reconfigurable circuit 12 is changeable by changing the configuration thereof.

The configuration unit 14 supplies configuration data 40 to the reconfigurable circuit 12 to form a target circuit. The configuration unit 14 may be formed as a command memory that outputs stored data by referring to the count of a program counter. In this case, the control unit 18 controls the output of the program counter. In this sense, the configuration data 40 maybe referred to as command data. The route units 24 and 29 function as feedback paths and connect the output of the reconfigurable circuit 12 to the input of the reconfigurable circuit 12. The output circuit 22 is formed as, for example, a sequential circuit such as a data flip-flop (D-FF) and receives the output of the reconfigurable circuit 12. The memory unit 27 is connected to the route unit 29. The reconfigurable circuit 12 is formed as a logic circuit such as a combinational circuit or a sequential circuit.

The memory 27 is provided with a storage area for storing, in accordance with an instruction from the control unit 18, a data signal output from the reconfigurable circuit 12 and/or a data signal input from an external source. The memory unit 27 is formed as a RAM. The writing of data in the memory unit 27 and the reading of the data therefrom each requires at least one clock cycle. The data signal stored in the memory unit 27 is transmitted to the input of the reconfigurable circuit 12 via the route unit 29, in accordance with an instruction from the control unit 18. The memory unit 27 is capable of supplying the data signal to the reconfigurable circuit 12 according to a predetermined timing schedule, in accordance with an instruction from the control unit 18. The memory unit 27 may output the data signal in accordance with an instruction from the configuration unit 14. When the configuration unit 14 is formed as a command memory, the configuration unit 14 may be provided with command data designating the timing of output from the memory unit 27. The configuration unit 14 may output the command data to the memory unit 27 in accordance with the count from the control unit 18. In this case, the configuration unit 14 also functions as a control unit for controlling the operation of the memory unit 27.

The reconfigurable circuit 12 is provided with logic circuits with variable functions. More specifically, the reconfigurable circuit 12 is provided with an array comprising a plurality of rows in each of which are provided logic circuits capable of selectively executing any of a plurality of operating functions. There is also provided connection units each of which is capable of configuring the connectivity between outputs of logic circuits in a front row to inputs of logic circuits in a back-end row. A plurality of logic circuits included in each stage constitute a set of logic circuits. The connection unit is also provided with the function as a state hold circuit (hereinafter, referred to as an FF circuit) for holding the outputs of logic circuits in a front row, i.e. the internal state thereof. The plurality of logic circuits are organized in a matrix. The function of each of the logic circuits and the connectivity between the logic circuits are configured in accordance with the configuration data 40 supplied from the configuration unit 14. The configuration data 40 is generated according to the following procedure.

A program 36 which is to be executed by the integrated circuit apparatus 26 is stored in a storage unit 34. The program 36 represents a description of operations to be performed by the logic circuits and is a representation of a signal processing circuit or a signal processing algorithm in a high-level language such as C. A compile unit 30 compiles the program 36 stored in the storage unit 34 for conversion into a data flow graph (DFG) 38 representing the program as a whole. The compile unit 30 then stores the DFG 38 in the storage unit 34. The data flow graph 38 is a representation of dependency in execution between operations carried out in sequence in the circuits and is a graph structure representation of the flow of operations involving input variables and constants. Generally, the data flow graph 38 is generated such that operations proceed from top to bottom.

A data flow graph processing unit 31 divides one or more DFGs generated by the compile unit 30 into a plurality of sub-DFGs, in accordance with the number of logic circuits included in the set of logic circuits in the reconfigurable circuit 12. More specifically, one or more DFGs are divided into smaller sizes such that the number of columns in the resultant sub-DFG is equal to fewer than the number of logic circuits per row in the reconfigurable circuit 12. When the reconfigurable circuit is provided with a six-column by three-row array of logic circuits, a DFG with more than six columns is divided into sub-DFGs each with the number of columns equal to or fewer than six columns.

The data flow graph processing unit 31 joins the plurality of sub-DFGs obtained by division such that the number of columns in the joined DFG does not exceed the number of columns of logic circuits. This will generate a joined DFG with the number of columns equal to or fewer than the number of columns of logic circuits in the set. Subsequently, the data flow graph processing unit 31 divides the joined DFG so as to generate a plurality of subjoined DFGs. In this process, the joined DFG is divided such that the number of rows in the subjoined DFG is equal to or fewer than the number of logic circuits in the set of logic circuits in the reconfigurable circuit. More specifically, the data flow graph processing unit 31 redivides the joined DFG such that the number of rows in the divided, subjoined DFG is equal to or fewer than the number of rows in the reconfigurable circuit 12. When the reconfigurable circuit 12 is provided with a six-column by three-row array of logic circuits, the joined DFG is divided into subjoined DFGs of three or fewer rows. The plurality of subjoined DFGs obtained by division are stored in the storage unit 34. By repeatedly generating, in the reconfigurable circuit 12, circuits defined by the plurality of subjoined DFGs obtained by division, a target circuit is represented in the reconfigurable circuit.

Depending on the structure of the program 36, a single or a plurality of DFGs may be generated at the time of compiling. For example, a plurality of DFGs are generated when a plurality of interrelated programs 36 are compiled or when the program 36 containing a plurality of routine programs that are repeatedly called is compiled. A plurality of subjoined DFGs are generated by generating a plurality of DFGs in the compile unit 30 of the processing apparatus 10, and by processing the DFGs generated by the compile unit-30 in the data flow graph processing unit 31 as described above.

Since the sequence of executing the plurality of data flow graphs 38 thus generated is unknown, it needs to be properly defined. When the sequence of executing the plurality of data flow graphs 38 is configured in an arbitrary manner, a situation may arise where the data flow graph 38, for which input data necessary for operations are not available, must be executed. For example, when the data flow graph 38 for generating input data necessary for the data flow graph 38 currently to be executed is subsequent to the data flow graph 38 currently to be executed in the sequence of execution, operations in associated circuits may be disabled. When it takes time to read necessary input data from the memory unit 27, requiring associated suspension of the process in wait for the data, it is difficult to implement a circuit configuration in a short period of time. This may present significant constraints when realtime processing, or high speed processing, is required.

For the reasons stated above, the data flow graph processing unit 31 according to the example processes the data flow graph 38 appropriately so that the number of times of mapping into the reconfigurable circuit 12 is minimized. A method of processing the data flow graph 38 will be described in detail with reference to FIG. 6.

A configuration data generation unit 32 generates the configuration data 40 from the data flow graph 38 determined by the data flow graph processing unit 31. The configuration data 40 is data for mapping the data flow graph 38 into the reconfigurable circuit 12. The configuration data 40 defines the functions of the logic circuits in the reconfigurable circuit 12, connectivity between the logic circuits and constants to be input to the logic circuits. The following description is directed to an example where the configuration data generation unit 32 generates the configuration data 40 for a plurality of circuits obtained by dividing a single target circuit to be generated.

Figure 2:
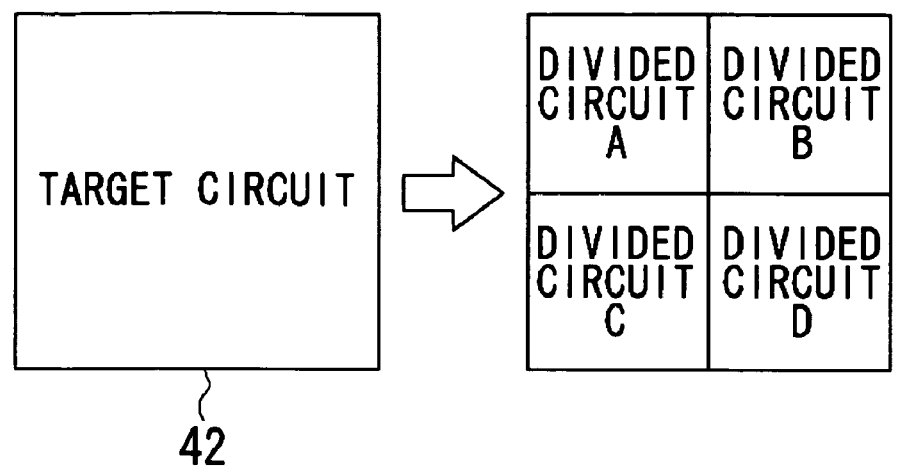
FIG. 2 is a diagram for explaining a plurality of circuits obtained by dividing a target circuit.

FIG. 2 is a diagram for explaining a plurality of circuits obtained by dividing a target circuit. Circuits generated by dividing a single target circuit will be referred to as divided circuits. In this example, a single target circuit 42 is divided in the vertical and horizontal directions, resulting in four divided circuits, i.e. a divided circuit A, a divided circuit B, a divided circuit C and a divided circuit D. The plurality of divided circuits are joined such that the number of columns in the joined circuit does not exceed the number of columns in the reconfigurable circuit 12. The original target circuit is regenerated as a new target circuit practically equal to the original target circuit.

In this example, providing that the number of nodes in the horizontal direction of the target circuit 42 to be generated is larger than the number of nodes (number of columns) in the horizontal direction of the reconfigurable circuit 12, the data flow graph 38 representing the target circuit 42 is divided horizontally by the data flow graph processing unit 31. A node in the data flow graph 38 represents the function of a logic circuit. When a vertical connection between nodes needs to be changed as demanded by the number of columns in the reconfigurable circuit 12 or the constraints imposed on inputs and outputs between ALUs, the data flow graph 38 representing the target circuit 42 is vertically divided. The control unit 18 may notify the data flow graph processing unit 31 of the array structure of the reconfigurable circuit 12. Alternatively, the array structure may be stored in the storage unit 34. In this example, the data flow graph 38 is a representation of dependency in execution between operations performed in sequence. The data flow graph processing unit 31 divides the data flow graph in accordance with the number of columns in the reconfigurable circuit 12 and sets up the divided data flow graphs as sub-data flow graphs.

The data flow graph processing unit 31 examines the connectivity between the plurality of sub-DFGs. Even when the division takes place only in the horizontal direction, the data flow graph processing unit 31 needs to examine the connectivity. When the connectivity has been examined, the data flow graph processing unit 31 generates a large, joined DFG by joining the plurality of sub-DFGs, in accordance with the connectivity examined. The joined DFG is generated such that the number of rows is equal to or fewer than the number of rows in the reconfigurable circuit 12. The data flow graph processing unit 31 divides the joined DFG into sizes with the number of rows equal to or smaller than the number of rows in the reconfigurable circuit 12, so as to generate a plurality of subjoined DFGs.

The configuration data generation unit 32 generates the configuration data 40 for a plurality of subjoined DFGs and stores the same in the storage unit 34. The plurality of data items of the configuration data 40 are for mapping the plurality of subjoined DFGs, each being smaller in size than the number of rows in the reconfigurable circuit 12, into the reconfigurable circuit 12. With this, the data flow graph larger in scale than the circuit scale of the reconfigurable circuit 12 is handled in a size that can be mapped into the reconfigurable circuit 12. By reformatting the DFG in accordance with the number of rows in the reconfigurable circuit 12 and generating the configuration data 40 representing the target circuit 42, a highly versatile processing apparatus 10 is produced. In an alternative perspective, the processing apparatus 10 according to the example enables any desired circuit to be formed using the reconfigurable circuit 12 with a relatively small circuit scale.

Figure 3:
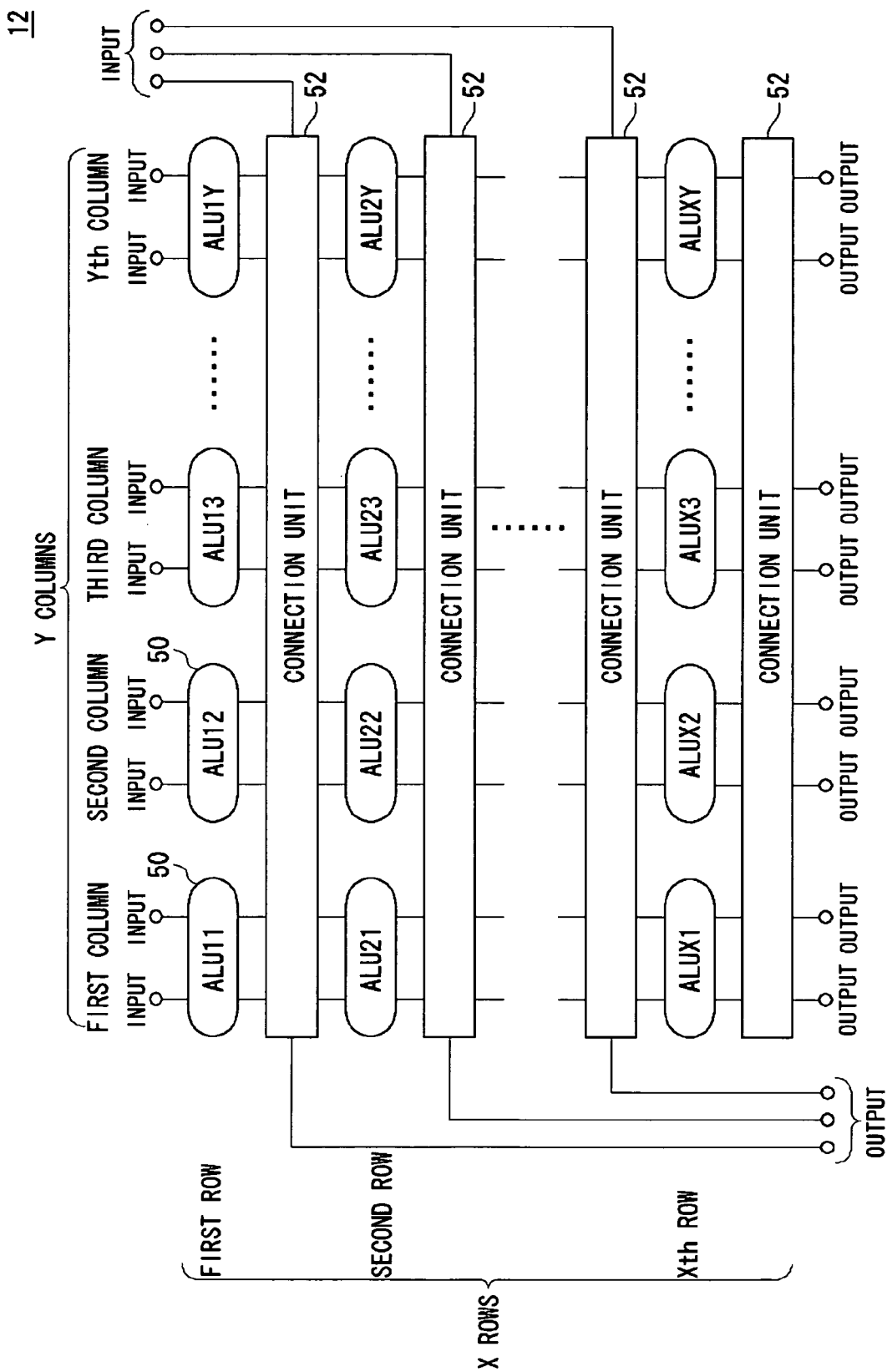
FIG. 3 illustrates the structure of a reconfigurable circuit.

FIG. 3 illustrates the structure of the reconfigurable circuit 12. The reconfigurable circuit 12 is provided with a plurality of columns of logic circuits constituted by logic circuits 50 capable of selectively executing any of a plurality of operating functions. More specifically, the reconfigurable circuit 12 is constituted by logic circuit columns each with a multiple-row structure and connection units 52 provided for respective rows. The term "multiple-row" refers to equal to or more than two rows. The connection unit 52 is capable of establishing arbitrary connectivity between an output of a front logic circuit and an input of a back-end logic circuit, or connectivity selected from predefined combinations of connectivity. The connection unit 52 is capable of retaining an output signal of a front logic circuit. In the reconfigurable circuit 12, operations proceed from top to bottom in the structure comprising multiple-row connections of logic circuits. The reconfigurable circuit 12 may be provided with a structure comprising a single row of logic circuits.

The reconfigurable circuit 12 is provided with an arithmetic logic unit as a logic circuit 50. An ALU is an arithmetic logic circuit capable of selectively executing any of a plurality of types of multi-bit operations. More specifically, an ALU is capable of selectively executing any of plurality of types of multi-bit operations such as logical sum, logical product and bit shift, according to configuration. Each of the ALUs is provided with a selector for configuring the unit for any of a plurality of operating functions. In the illustrated example, each ALU is provided with two input terminals and two output terminals.

As illustrated, the reconfigurable circuit 12 is formed as an X-row Y-column ALU array provided with a total of X ALUs in the vertical direction and a total of Y ALUs in the horizontal direction. Input variables and constants are input to an ALU11, an ALU12, ... an ALULY in the first row for predetermined operations for which the ALUs are configured. Outputs of results of operations are input to an ALU21, an ALU22, ... an ALU2Y, in accordance with the connection set in the connection unit 52 of the first row. The connection unit 52 in the first row is wired to be capable of establishing arbitrary connectivity between outputs of the ALUs in the first row and inputs of the ALUs in the second row, or connectivity selected from predefined combinations of connectivity. The desired wiring is activated by configuration. The connection units 52 in the subsequent rows, including the final, Xth row, are similarly configured. The column of ALUs corresponds to the ALU set.

The reconfigurable circuit 12 of FIG. 3 is structured such that the connection unit 52 is interposed between adjacent rows so that the connection unit 52 and the ALU alternate in each column. By disposing the connection unit 52 below the ALU in each column, the reconfigurable circuit 12 is partitioned into X rows of reconfigurable units, each row comprising ALUs from respective ALU columns. More specifically, a single row of reconfigurable unit comprises a row of ALUs from respective columns and a row of connection unit 52. The way that the reconfigurable circuit 12 is partitioned is in compliance with the distribution of FF circuits included in the connection unit 52. For example, when the connection unit 52 is provided for every second rows of ALUs and a connection unit not provided with an FF circuit connects between the two intervening rows of ALUs, the reconfigurable circuit 12 is partitioned into X/2 rows of reconfigurable units, each row comprising two rows of ALUs from respective columns. As an alternative to this, FFcircuits maybe provided per any desired number of rows of ALUs. With this, the reconfigurable circuit 12 is organized into a desired number of rows of reconfigurable units.

Configuration of a circuit is done in one clock. More specifically, the configuration unit 14 maps the configuration data into the reconfiguration circuit 12 at each clock cycle. Outputs of ALUs are retained in the connection unit 52 subsequent to the ALUs. Reading and writing of data in the memory unit 27 are also done in one clock each. Accordingly, at least the time spent in two rows of ALUs for processing is required to write data in the memory unit 27 and to read the data therefrom.

The connection unit 52 is provided with the function of supplying variable and constants supplied from an external source or the memory unit 27 to a target ALU. This function will be referred to as a midstream input function. The connection unit 52 is also capable of directly outputting the result of operation in a front ALU to an external destination. This function will be referred to as a midstream output function. With this structure, it is possible to form a variety of combinational circuits and the flexibility in design is improved.

Figure 4:
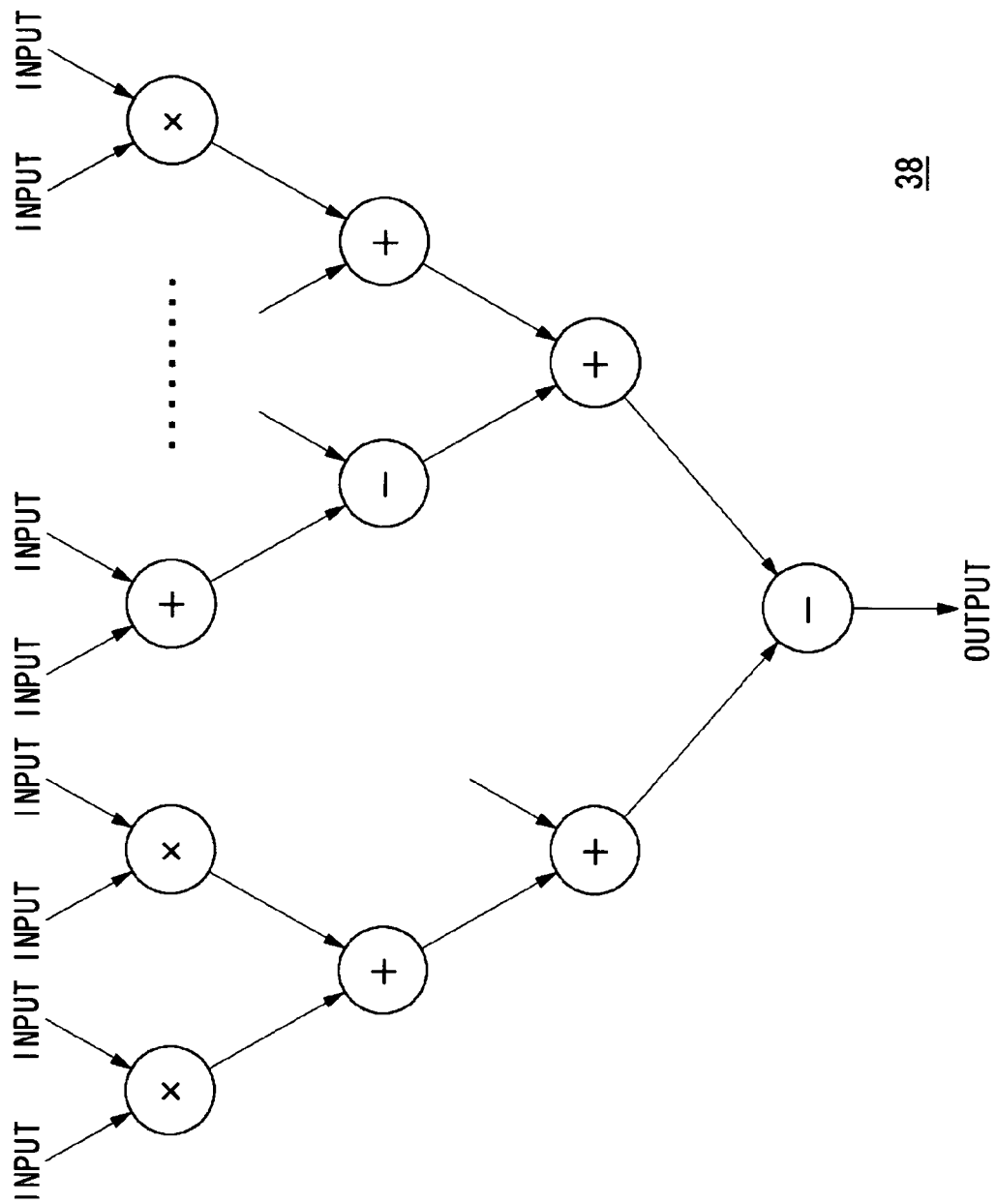
FIG. 4 is a chart for explaining the structure of a data flow graph.

FIG. 4 is a chart for explaining the structure of the data flow graph 38. In the data flow graph 38, the flow of operations involving input variables and constants is represented by a graph structure showing successive steps. In FIG. 4, an operator is denoted by a circle, which represents a node. The configuration data generation unit 32 generates the configuration data 40 for mapping the data flow graph 38 into the reconfigurable circuit 12. In this example, when the data flow graph 38 is so large that it cannot be mapped into the reconfigurable circuit 12, the data flow graph 38 is divided into a plurality of areas for later joining. The joined areas are divided for a second time so as to generate the configuration data 40 of the divided circuits. In order to implement the flow of operations specified by the data flow graph 38 on the circuit, the configuration data 40 specifies logic circuits to be assigned operating functions, defines the connectivity between the logic circuits and defines input variables and input constants. As such, the configuration data comprises selection information supplied to selectors for selecting the function of each of the logic circuits 50, connectivity information for configuring the wiring in the connection unit 52, necessary variable data and constant data, etc.

Referring back to FIG. 1, in configuring circuits, the control unit 18 reads, from the storage unit 34, the configuration data 40, comprising a plurality of data items, for forming the single target circuit 42. When the configuration unit 14 is configured as a command memory, the control unit 18 supplies a program count to the configuration unit 14. In accordance with the count, the configuration unit 14 sets preset data stored therein in the reconfigurable circuit 12 as command data. The configuration unit 14 may be formed to include a cache memory or a memory of other types. The control unit 18 may receive the configuration data 40 from the storage unit 34 and supply the configuration data 40 to the configuration unit 14. The configuration unit 14 may alternatively store the configuration data without the intervention of the control unit 18. In this case, the control unit 18 controls the reading of data by the configuration unit 14 so that the configuration data adapted to the target circuit 42 is supplied to the reconfigurable circuit 12, from among the configuration data, comprising a plurality of data items, stored in the configuration unit 14.

The configuration unit 14 sets the configuration data 40 in the reconfigurable circuit 12 so as to reconfigure the circuits in the reconfigurable circuit 12 step by step. This will enable the reconfigurable circuit 12 to execute target operations based on the target circuit. The reconfigurable circuit 12 uses ALUs with high operating performance as basic cells. As the reconfigurable circuit 12 and the configuration unit 14 are formed on a single chip, configuration can take place at a high speed, consuming, for example, only one clock. The control unit 18 is provided with the clock function. A clock signal is supplied to the output circuit 22 and the memory unit 27. The control unit 18 may include a quaternary counter so as to supply a count signal to the configuration unit 14.

Figure 5:
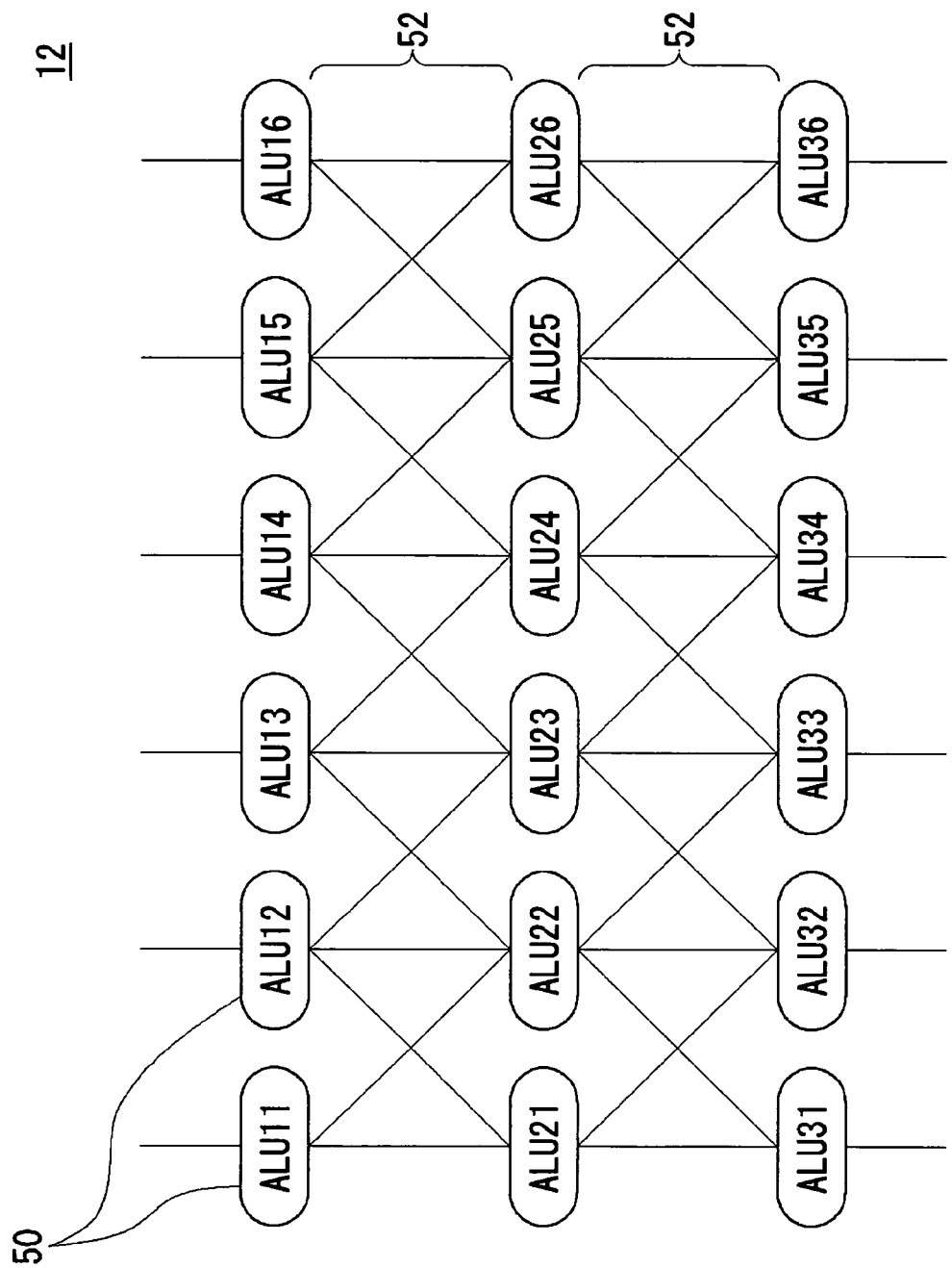
FIG. 5 illustrates the connectivity between ALUs in a reconfigurable circuit.

FIG. 5 illustrates a relation between ALUs in the reconfigurable circuit 12. In FIG. 5, illustration of a connection unit 52 disposed between ALUs is omitted. The reconfigurable circuit 12 illustrated in FIG. 5 is configured as an ALU array in which six ALUs are provided in the horizontal direction and three ALUs are provided in the vertical direction. Input variables and constants are input to the ALU11, the ALU12, ... the ALU16 in the first row so that operations designated by the configuration are performed. The outputs of the results of operations are input to the ALU21, the ALU22, ... the ALU26 in the second row in accordance with the connection established in the connection unit 52 in the first row. The connection unit 52 in the first row is wired to be capable of achieving connectivity, carrying certain constraints, between the outputs of ALUs in the first row and the inputs of ALUs in the second row. Desired wiring is activated by configuration insofar as the constraints are not violated. This is also true of the connection unit 52 in the second row. The ALUs in the third, final row output final results of operations. The connection unit 52 is formed such that logic circuits physically close to each other are connectable across ALU rows. With this, it is ensured that the wiring length is short and the circuit scale is reduced. Consequently, low power consumption and high-speed processing are achieved.

In the reconfigurable circuit 12 illustrated in FIG. 5, a three-row by six-column array of ALUs are located. Wires from an ALU in a front row are only connectable to three ALUs in a back-end row. As illustrated, the input to an ALU in a back-end row is only connectable to the ALU immediately above and the ALUs to the right and left thereof. The output of an ALU in a front row is only connectable to the ALU immediately below and the ALUs to the right and left thereof. For example, the input to the ALU22 is only connectable to three ALUs including the ALU11, the ALU12 and the ALU13. The output of the ALU22 is only connectable to three ALUs including the ALU31, the ALU32 and the ALU33. When there is not an ALU to the right or to the left, the input or the output is only connectable in two directions. With such wiring, the number of wires is significantly reduced as compared with a case where connection can be established between any pairs of ALUs in a front row and in a back-end row.

Figure 6:
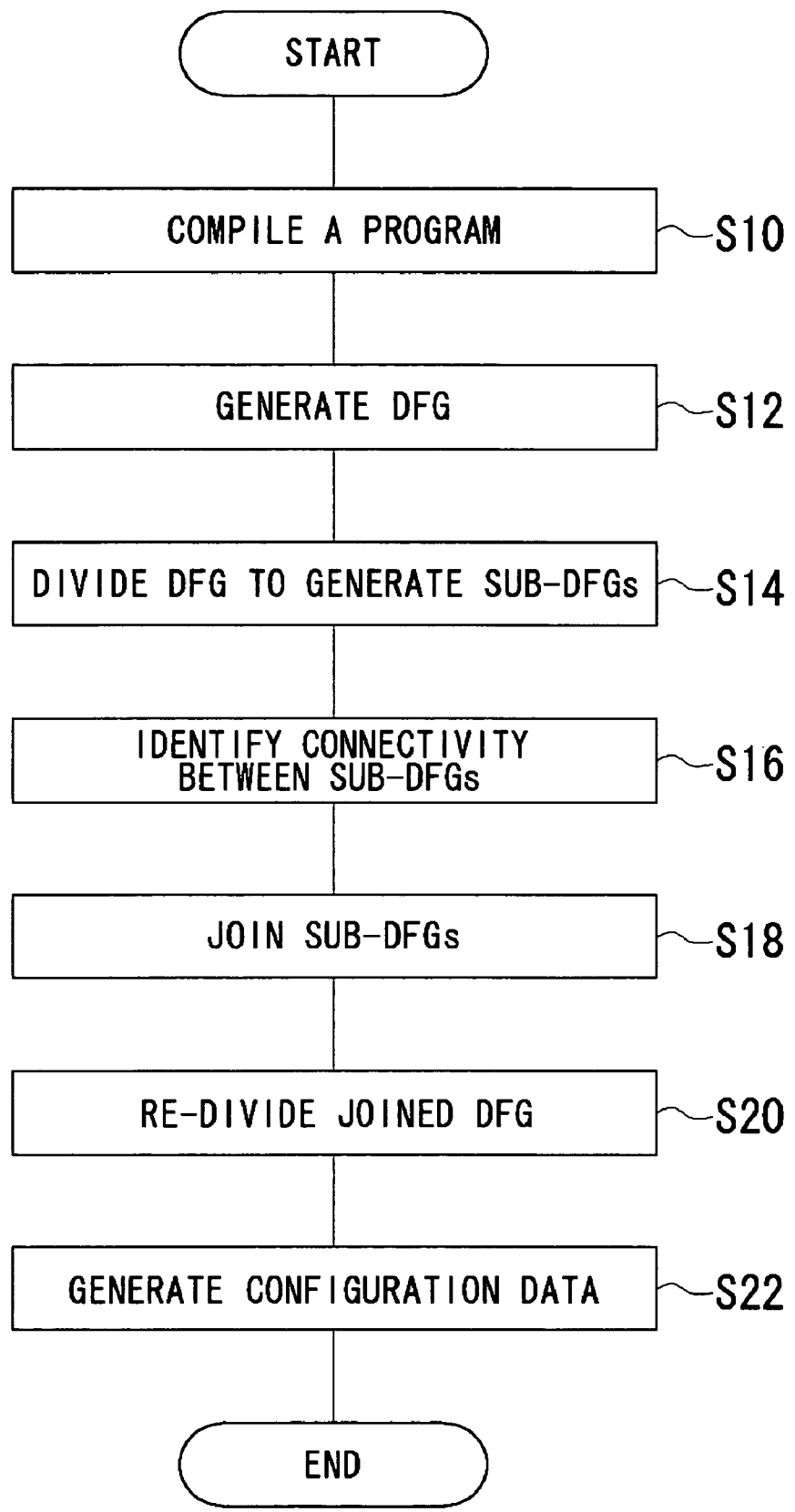
FIG. 6 is a flowchart for processing a data flow graph according to the example.

FIG. 6 is a flowchart for processing the data flow graph 38 according to the example. The compile unit 30 compiles the program 36 (S10) so as to generate at least one data flow graphs 38 (S12). The data flow graph processing unit 31 divides the at least one data flow graph 38 thus generated into sub-DFGs such that the number of columns in the sub-DFG is equal to fewer than the number of columns in the reconfigurable circuit 12 (S14). The data flow graph processing unit 31 examines and identifies the connectivity between the plurality of sub-DFGs obtained by division (S16).

Subsequently, the data flow graph processing unit 31 joins the plurality of sub-DFGs by referring to the connectivity between the plurality of sub-DFGs so as to generate a joined DFG (S18). The data flow graph processing unit 31 redivides the joined DFG generated by joining the plurality of sub-DFGs into sizes with the number of rows equal to fewer than the number of rows in the reconfigurable circuit 12 (S20). The configuration data generation unit 32 generates the configuration data 40, based on DFGs obtained by redivision (S22). The configuration data specifies the functions of and connectivity in the reconfigurable circuit 12. The reconfigurable circuit 12 is capable of executing a target circuit process by being configured for various functions by the configuration data 40.

Figure 7:
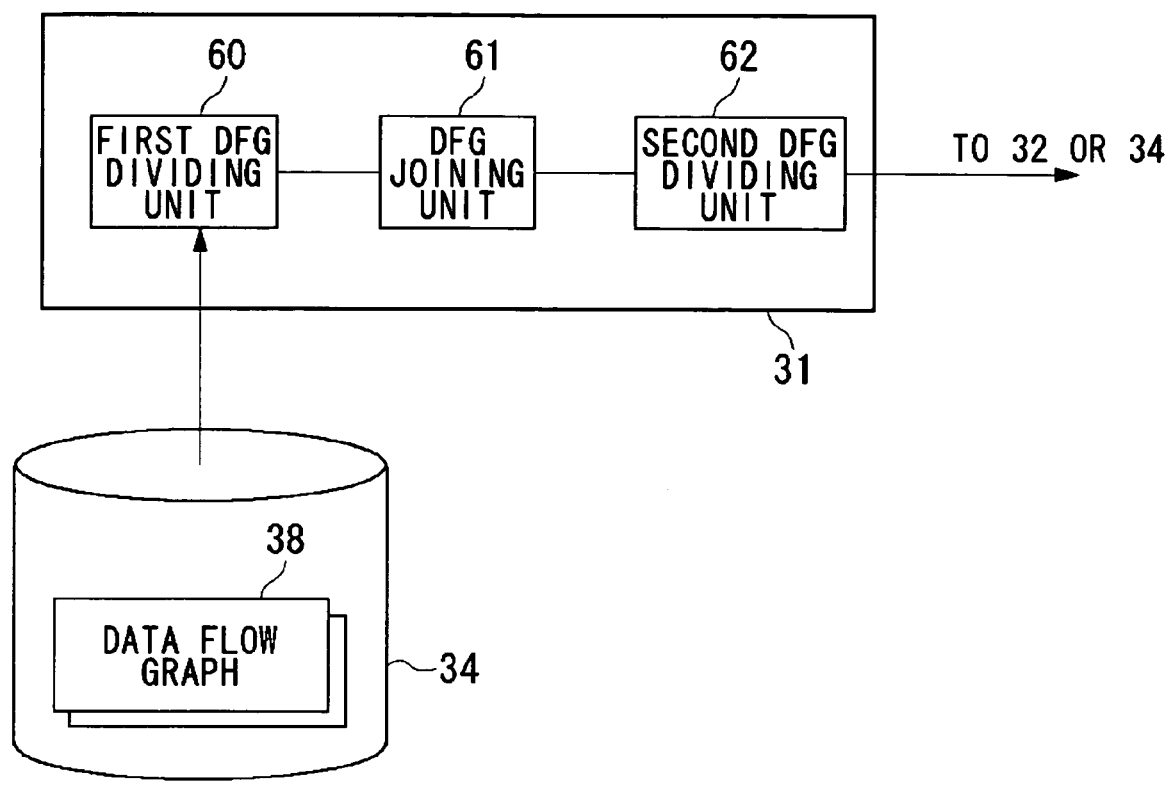
FIG. 7 illustrates the structure of a data flow graph processing unit.

FIG. 7 illustrates the structure of the data flow graph processing unit 31. The data flow graph processing unit 31 is provided with a first DFG dividing unit 60, a DFG joining unit 61 and a second DFG dividing unit 62. The functions of the data flow graph processing unit 31 according to the example are implemented in the processing apparatus 10 by a CPU, a memory and a DFG processing program loaded into the memory. FIG. 7 depicts functional blocks implemented by the cooperation of these. The DFG processing program may be built in the processing apparatus 10 or supplied from an external source in the form of a recording medium storing the program. Therefore, it will be obvious to those skilled in the art that the functional blocks may be implemented by a variety of manners including hardware only, software only or a combination of both.

(Division of DFG)

When the number of columns in the DFG generated by the compile unit 30 exceeds the number of logic circuits in the set of logic circuits in the reconfigurable circuit 12, the first DFG dividing unit 60 divides the DFG such that the number of columns in the divided DFG is equal to or fewer than the number of sets of logic circuits in the reconfigurable circuit 12. With this, the DFG is divided into a plurality of sub-DFGs.

Figure 8:
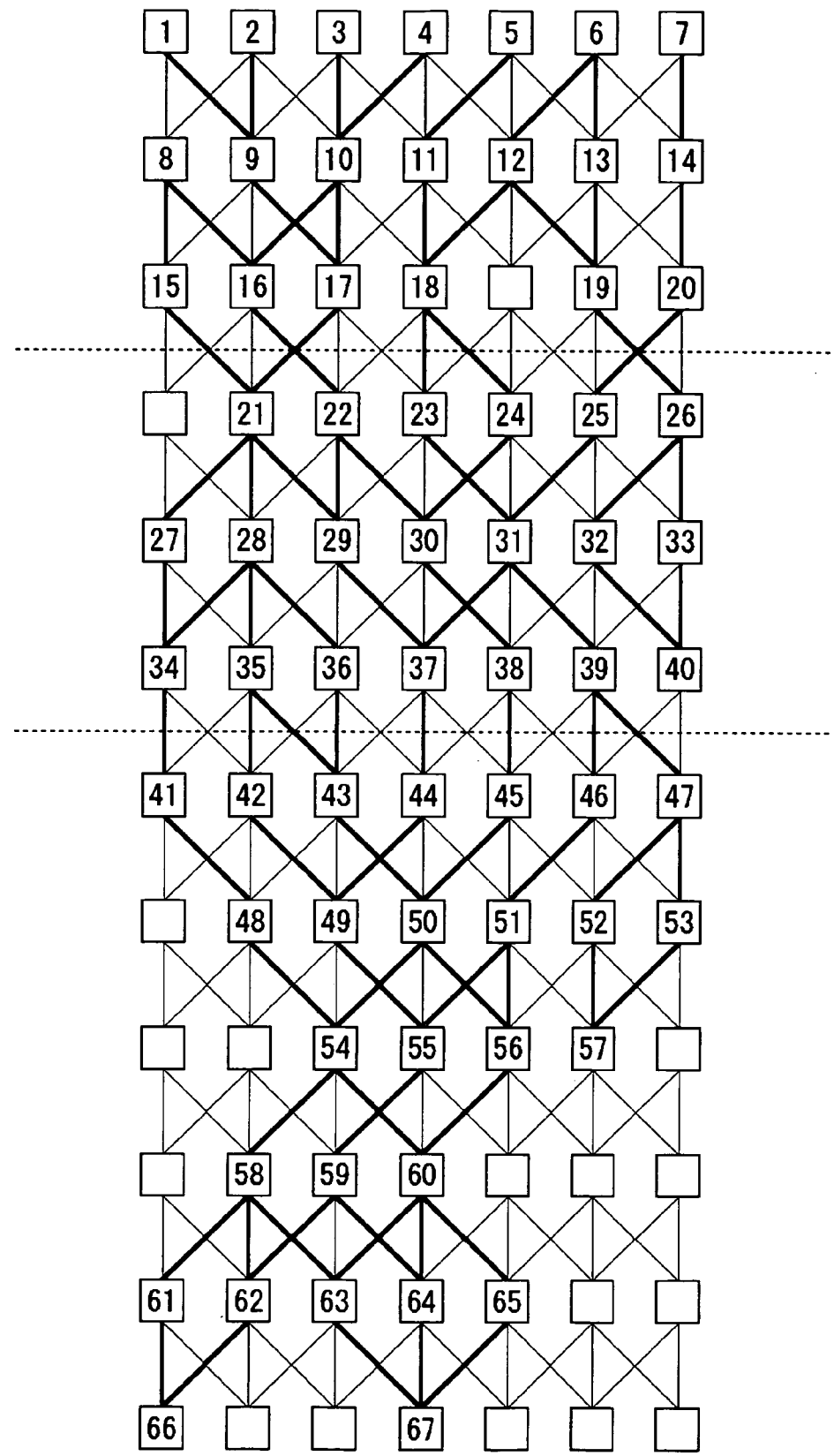
FIG. 8 illustrates an example of DFG that exceeds in size the circuit scale of the reconfigurable circuit.

FIG. 8 illustrates an example of DFG that exceeds in size the circuit scale of the reconfigurable circuit 12. Referring to FIG. 8, numerals in squares identify nodes. The DFG is comprised of a twelve-row by seven-column array of nodes. Given that the ALUs are organized in a three-row by six-column array as illustrated in FIG. 5, the scale of the DFG exceeds that of the ALU circuits both in the horizontal and vertical directions. The DFG needs to be ultimately divided to a scale that could be mapped into the ALU circuits, i.e., the scale equal to smaller than the three-row by six-column array. In this example, division in the direction of rows (i.e., in the direction that successive rows are encountered) is deferred for later execution. Firstly, the first DFG dividing unit 60 divides the DFG such that the number of nodes in the direction of columns is equal to or fewer than six.

The first DFG dividing unit 60 divides the seven-column DFG illustrated in FIG. 8 into sub-DFGs such that the number of columns is equal to fewer than 6 and the number of nodes used for connection between a front row and a back-end row does not exceed six. In this process, the ALUs are subject to the constraints as illustrated in FIG. 5 permitting connections to occur only in three directions.

Referring to FIG. 8, the connectivity between the third row and the fourth row will be examined. The node 21 is connected to the node 15 and the node 17 so that it needs to be placed in the second column as illustrated. In the fourth row, the node 21 in the second column through the node 25 in the sixth row are placed without any gaps in between. The node 25 is connected to the node 20 in the seventh column. This means that the ALUs in the fourth row are connected to seven columns of ALUs in the third row. This shows that no direct connection should be established between the ALUs in the third row and the ALUs in the fourth row and that vertical division is required.

Similarly, the connectivity between the sixth row and the seventh row will be examined. In the seventh row, the nodes 41 through 47 are placed without any gaps in between. Viewed from the sixth row, outputs from the node 34 through the node 39 are connected to seven ALUs in the seventh row. Accordingly, the ALUs in the sixth row are connected to the seven columns of ALUs in the seventh row. This shows that no direction connection should be established between the ALUs in the sixth row and the ALUs in the seventh row and that division is required. The aforementioned process is executed by the first DFG dividing unit 60.

Figure 9:
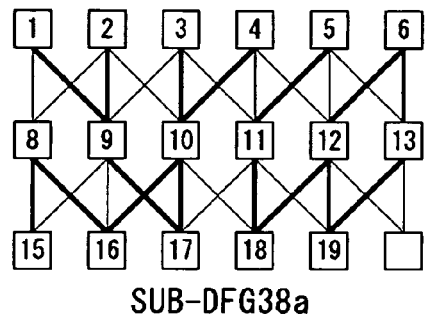
FIG. 9 illustrates six sub-DFGs generated by dividing the DFG of FIG. 8.
Figure 9:
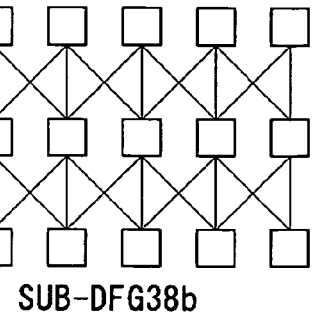
Figure 9:
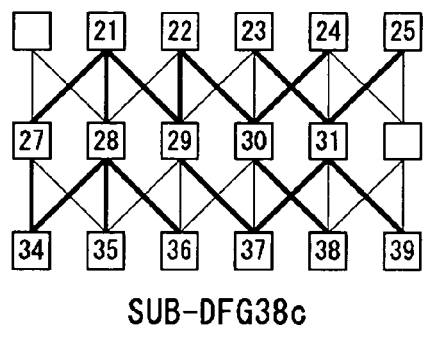
Figure 9:
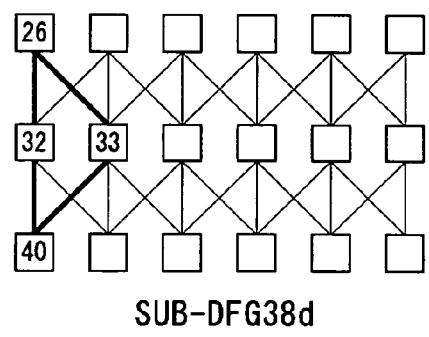
Figure 9:
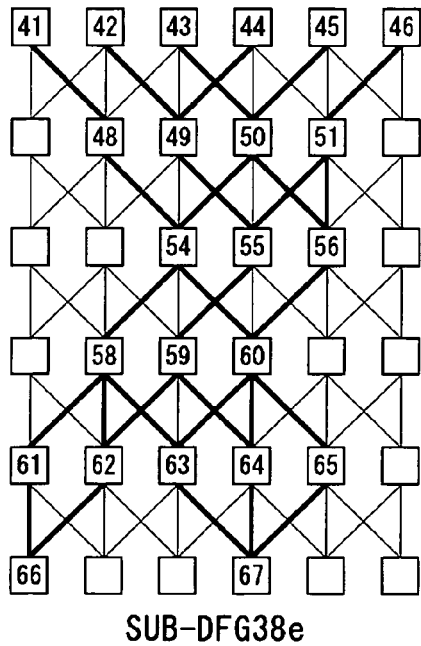
Figure 9:
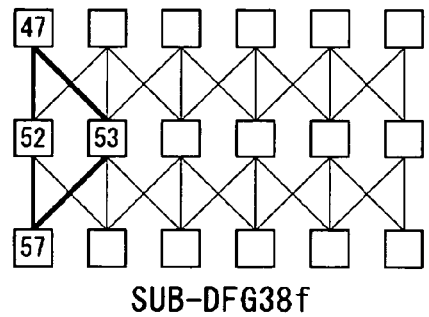

FIG. 9 illustrates six sub-DFGs generated by dividing the DFG illustrated in FIG. 8. The first DFG dividing unit 60 generates sub-DFGs such that the number of columns is equal to fewer than six. The sub-DFG is generated such that nodes are justified to the left and to the top as much as possible. Sub-DFGs 38a-38f are generated such that the number of columns is six or fewer. No restriction is imposed in the direction of rows.

(Identifying Connectivity between Sub-DFGs)

The DFG joining unit 61 examines the connectivity between the plurality of sub-DFGs. For example, providing that the output of the sub-DFG 38a is required as input to the sub-DFG 38c, the output of the sub-DFG 38a is identified as being connected to the input of the data flow graph 38c. The DFG joining unit 61 examines the connectivity such as this between the sub-DFGs.

Figure 10:
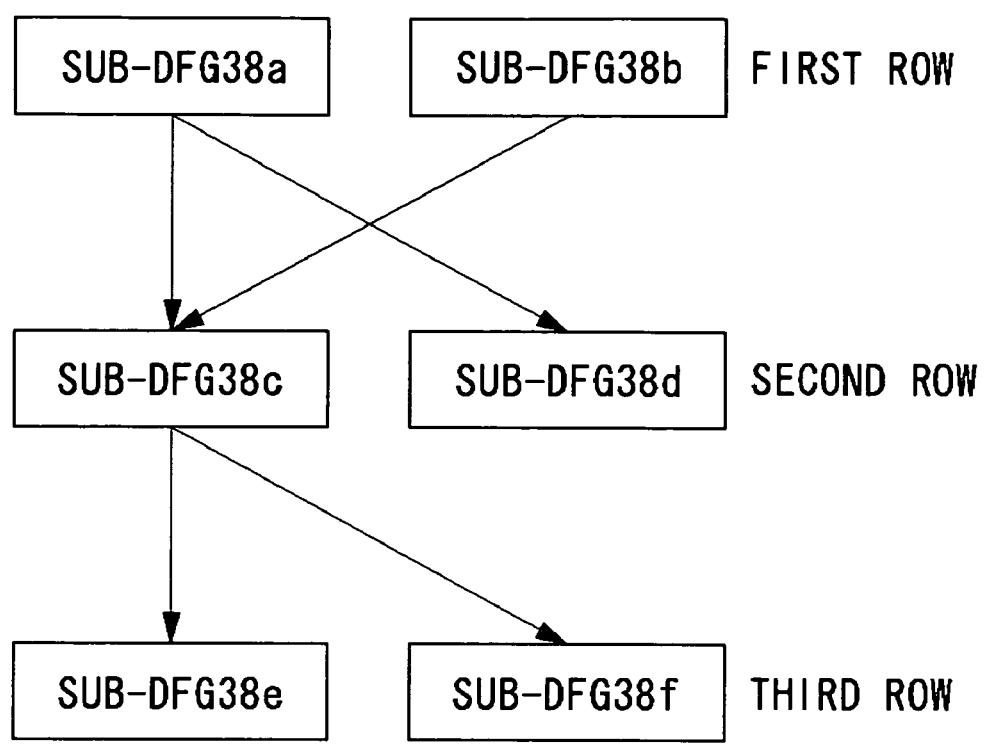
FIG. 10 illustrates the connectivity between sub-DFGs identified by a DFG joining unit.

FIG. 10 illustrates the connectivity between the sub-DFGs illustrated in FIG. 9 identified by the DFG joining unit 61. In this case, a sub-DFG is considered as a block and the connectivity between the blocks is identified. In this connectivity chart, the flow of process is illustrated to occur from top to bottom. No connectivity is established between the sub-DFG 38a and the sub-DFG 38b. The output of the sub-DFG 38a is connected to the inputs of the sub-DFG 38a and the sub-DFG 38d. The output of the sub-DFG 38b is connected to the input of the sub-DFG 38c. The output of the sub-DFG 38c is connected to the inputs of the sub-DFG 38e and the sub-DFG 38f. The connectivity such as this is derived from the connections between the nodes in the DFG illustrated in FIG. 8.

(Joining Sub-DFGs)

Figure 11:
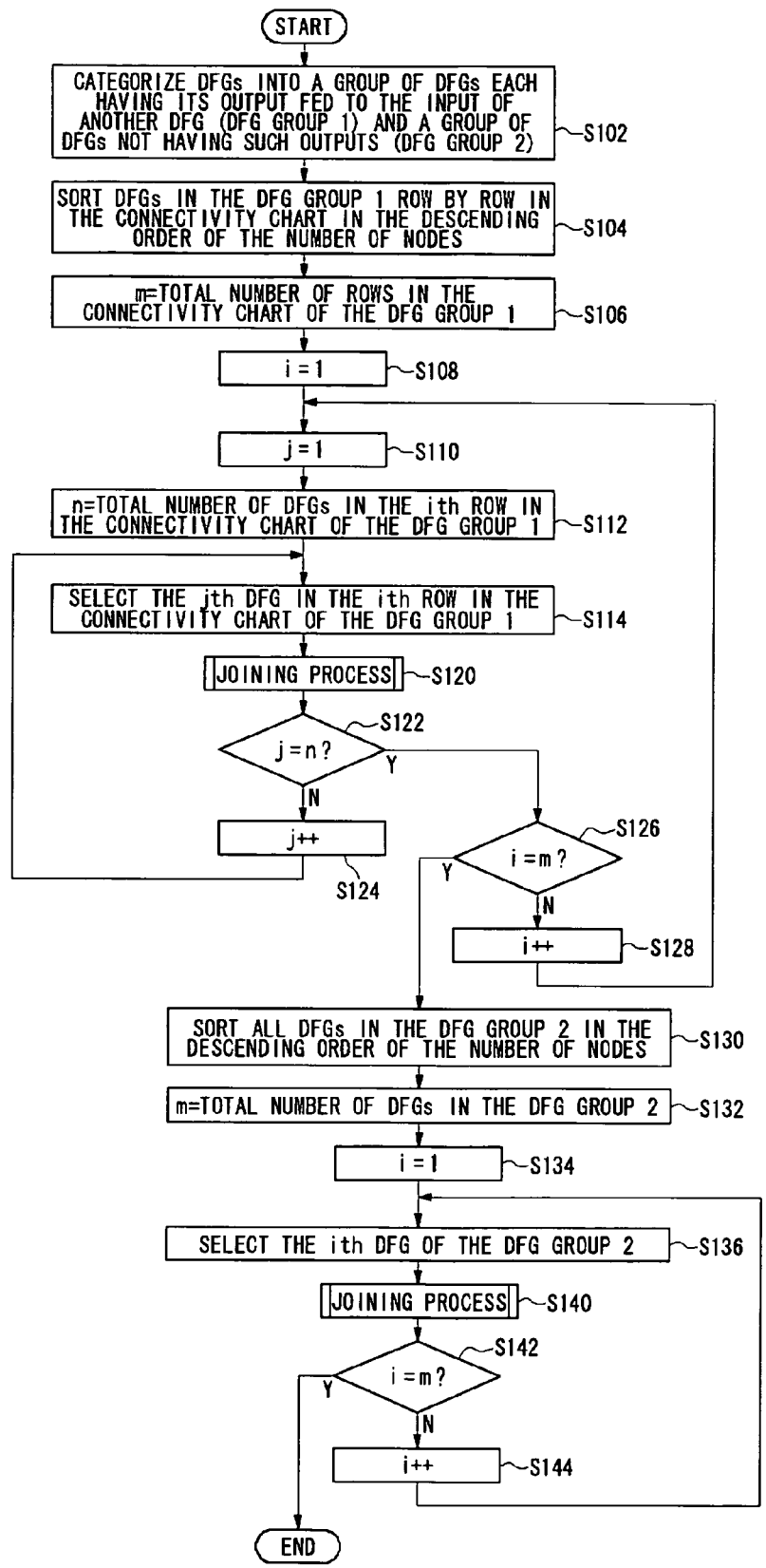
FIG. 11 is a flowchart for joining sub-DFGs.
Figure 12:
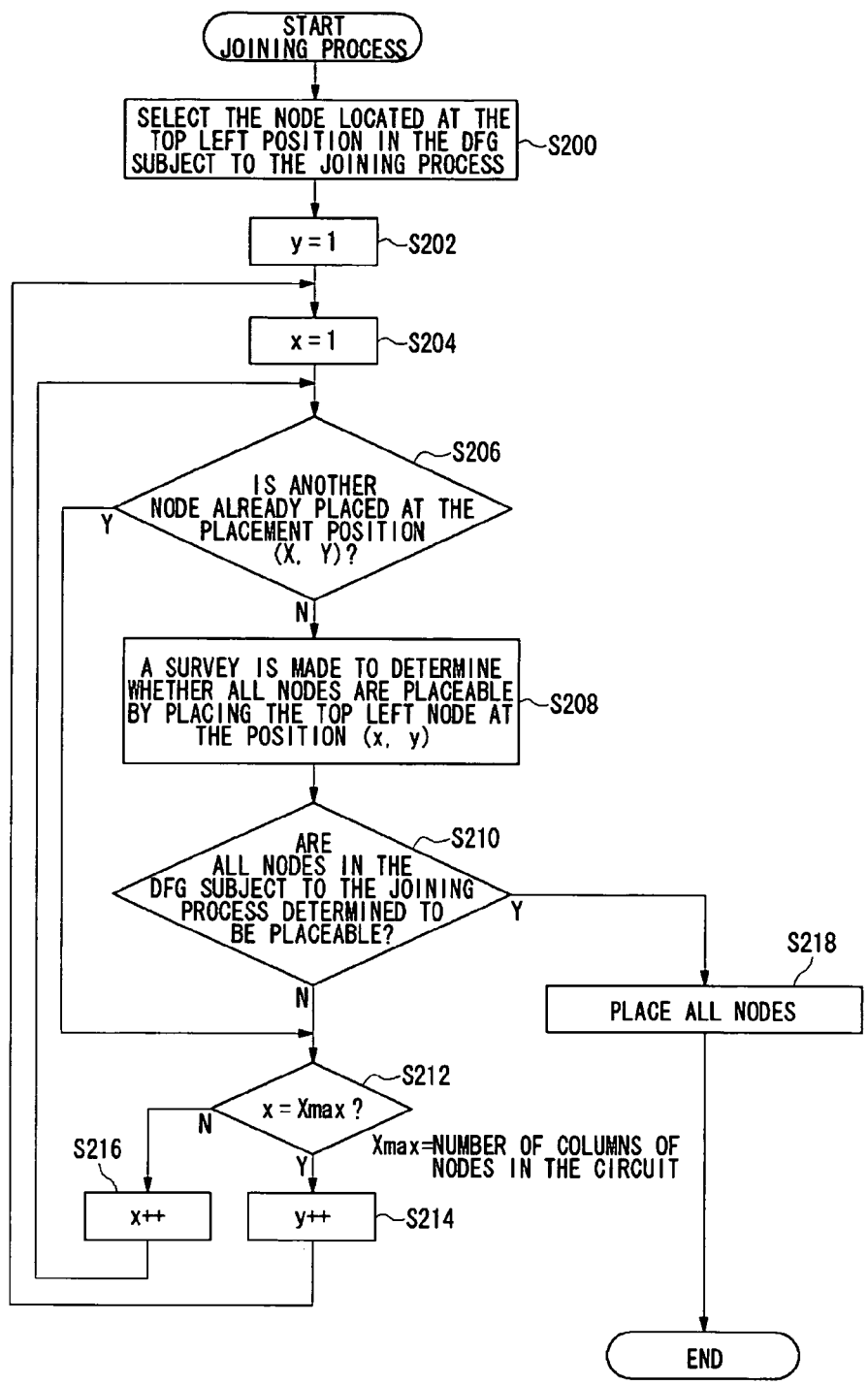
FIG. 12 is a flowchart for a joining process of FIG. 11.

FIG. 11 is a flowchart for joining sub-DFGs. A specific process for placing the sub-DFGs in a virtual node space is illustrated in FIG. 12. First, on the basis of the connectivity chart of FIG. 10, the sub-DFGs are categorized into a group of DFGs each having the output thereof supplied to the input of another sub-DFG (DFG group 1) and a group of DFGs having the output thereof not supplied to the input of another sub-DFG (DFG group 2) (S102). Referring to FIG. 10, the output of the sub-DFG 38a represents the input to the sub-DFGs 38c and 38d. The output of the sub-DFG 38b represents the input to the sub-DFG 38c. The output of the sub-DFG 38c represents the input to the sub-DFGs 38e and 38f. Accordingly, the sub-DFGs 38a, 38b and 38c belong to the DFG group 1, and the sub-DFGs 38d, 38e and 38f belong to the DFG group 2 since their outputs are not supplied to the input of another sub-DFG.

Since the outputs of the sub-DFGs belonging to the DFG group 1 are required by other sub-DFGs, the sub-DFGs of the DFG group 1 are preferably placed toward the top as much as possible in order to reduce the scale of the joined DFG generated by joining the sub-DFGs. This is because the sub-DFGs of the DFG group 2 need to be connected beneath the sub-DFGs of the DFG group 1. The sub-DFGs belonging to the DFG group 2 may be placed anywhere as long as they can receive input data for their own. Therefore, according to the example, the joining process on the DFG group 2 is executed after the joining process on the DFG group 1. With this, the sub-DFGs belonging to the DFG group 2 can be placed between sub-DFGs already placed. This will help reduce the number of rows in the joined DFG generated by joining. Accordingly, the number of subjoined DFGs ultimately generated by redividing the joined DFG is minimized so that efficient mapping into the reconfigurable circuit 12 is achieved.

A search is carried out row by row in the connectivity chart of FIG. 10 so as to arrange the sub-DFGs in the DFG group 1 in the descending order of the number of nodes (S104). Comparing between the sub-DFGs 38a and 38b of the DFG group 1 in the first row for the number of nodes, the number of nodes in the sub-DFG 38a is seventeen and the number of nodes in the sub-DFG 38b is three, revealing that the sub-DFG 38a accommodate a larger number of nodes. Accordingly, the sub-DFGs of the DFG group 1 in the first row are arranged in the order of the sub-DFG 38a followed by the sub-DEF 38b. Since the sub-DFG 38c is the only group 1 sub-DFG in the second row, there is no need to sort in the descending order of the number of nodes. It will be assumed that m indicates a total number of rows occurring as the sub-DFGs of the DFG group 1 are connected. The DFG group 1 is comprised of the sub-DFGs 38a and 38b in the first row and the sub-DFG 38c in the second row. Therefore, the total number of rows m in the DFG group 1 is two. A variable i is set to 1 (S108) and a variable j is set to 1 (Sl10). It will be assumed that n indicates a total number of DFGs in the ith row occurring as the sub-DFGs of the DFG group 1 are joined (S112). Since the total number of sub-DFGs of the DFG group 1 in the first row is two, n is set to two.

The jth sub-DFG in the ith row occurring as the sub-DFGs of the DFG group 1 are joined is selected (S114). Initially, the sub-DFG 38a, the first sub-DFG in the first row, is selected. Subsequently, a joining process is carried out on the sub-DFG 38a thus selected (S120). The joining process will be described later in detail with reference to FIG. 12.

After the joining process, a determination is made as to whether j has reached n (S122). Since j=1 and n=2 in this case (N in S122), j is incremented by 1 (S124) and control is returned to S114. In S114, the sub-DFG 38b, the second sub-DFG of the DFG group 1 in the first row, is selected and subjected to the joining process. Thereafter, j=n (Y in S122). A determination is then made as to whether i has reached m (S126). Since i=1 and m=2 (N in S126), i is incremented by 1 (S128). Control is returned to S110 and j is set to 1. The total number n of DFGs in the second row is set to 1.

The sub-DFG 38c, the first sub-DFG in the second row, is selected and subjected to the joining process. Since j=1 and n=1 (Y in S122), a determination is made as to whether i has reached m (S126). i=2 and m=2 (Y in S126) and this completes the joining of all sub-DFGs belonging to the DFG group 1.

Subsequently, the sub-DFGs belonging to the DFG group 2 are joined. A search is carried out in the DFG group 2 so as to arrange all sub-DFGs belonging to the DFG group 2 in the descending order of the number of nodes (S130). The number of nodes in the sub-DFG 38*d* belonging to the DFG group 2 is four, the number of nodes in the sub-DFG 38*e* is twenty-three, and the number of nodes in the sub-DFG 38*f* is four. The number of nodes of the sub-DFG 38*d* is equal to that of the sub-DFG 38*f*, meaning that whichever may be joined first. In this example, the sub-DFG 38*d* is placed ahead of the sub-DFG 38*f*, resulting in the order of the sub-DFG 38*e*, the sub-DFG 38*d* and the sub-DFG 38*f* being set. Subsequently, it is assumed that m indicates a total of number of DFGs in the DFG group 2 (S132). In this case, m=3. Further, i is set to 1 (S134).

In accordance with the order thus set, the ith sub-DFG of the DFG group 2 is selected (S136). In this case, the sub-DFG 38*e*, the first of the DFG group 2, is selected. The sub-DFG 38*e* is subjected to the joining process (S140). After the joining process, a determination is made as to whether i has reached m (S142). Since i=1 and m=3 (N in S142), i is incremented by 1 and control is returned to S136. The above process is repeated. By selecting the second sub-DFG 38*d* for the joining process and selecting the third sub-DFG 38*f* for the joining process, i reaches m (Y in S142). This completes the joining of all sub-DFGs.

In this example, by joining the DFG group 1 in advance of the DFG group 2, the joining process as a whole proceeds in the sub-DFG 38*a*, the sub-DFG 38*b*, the sub-DFG 38*c*, the sub-DFG 38*e*, the sub-DFG 38*d* and the sub-DFGf in the stated order.

According to this example, the joining process proceeds from the sub-DFG at the top, in both the DFG group 1 and the DFG group 2. With this, it is ensured that the input data to the sub-DFG newly subjected to the joining process may be provided from the output of the sub-DFG already joined or from an external source so that time delay incurred before the input data is available is reduced. This is due to the fact that DFGs are processed so that operations proceed from top to bottom. With this, wait for data readout etc. occurring in the process of configuring the reconfigurable circuit 12 is minimized, facilitating efficient generation of the configuration data.

FIG. 12 is a flowchart for the joining process denoted in S120 and S140 of FIG. 11. In the joining process, the sub-DFGs are placed and joined in a virtual node space with the number of columns thereof adapted to the number of columns in the reconfigurable circuit 12.

Figure 13:
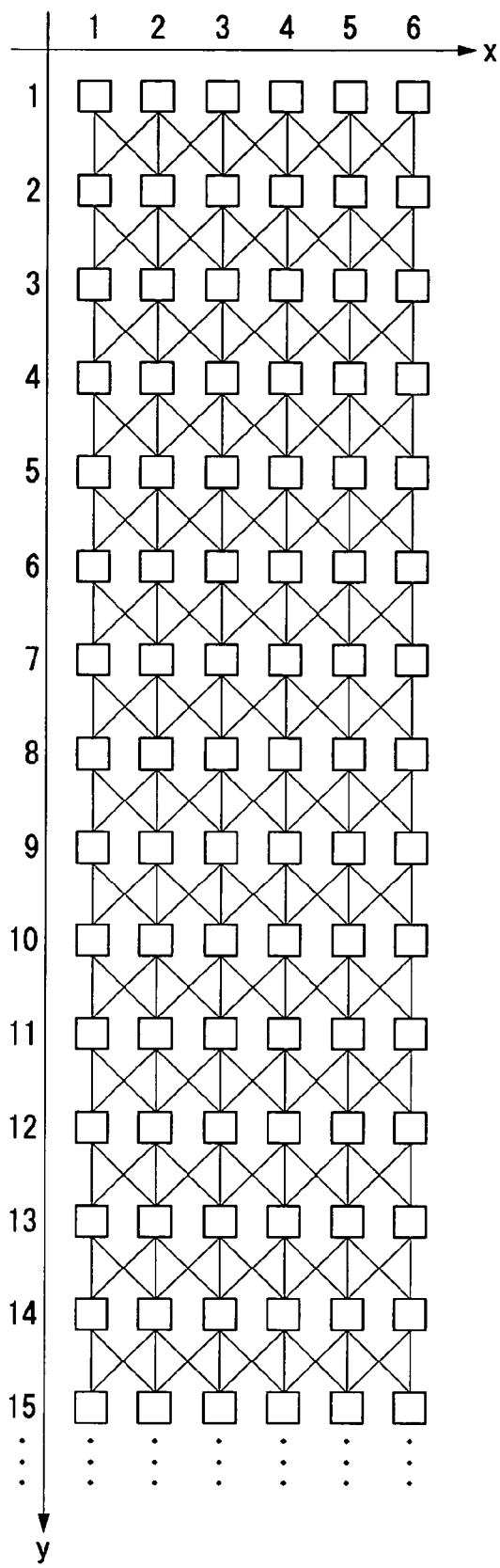
FIG. 13 illustrates a virtual node space.

FIG. 13 illustrates a virtual node space in which the number of columns is six and the number of rows is unlimited. In the joining process, the sub-DFGs are placed so as to be fitted in this node space. The horizontal direction (direction of columns) is defined as the x-axis and the vertical direction (direction of rows) is defined as the y-axis.

Firstly, a description will be given of a procedure for the joining process on the first sub-DFG 38*a*. When the joining process on the sub-DFG 38*a* is initiated, there are no other sub-DFGs placed in the virtual node space. The node located at the top left position in the sub-DFG subject to the joining process is selected (S200). The node located at the top left position in the sub-DFG 38*a* initially subject to the joining process is the node with the node ID of 1 (see FIG. 9). Subsequently, a variable y is set to 1 (S202) and a variable x is set to 1 (S204). A determination is then made as to whether another node is already placed at the position (x, y) (S206). Since the sub-DFG 38*a* is the DFG placed at the start, no other node is located at (1, 1). When no other node is placed at the position (x, y) (N in S06), a survey is made to determine whether all nodes in the sub-DFG 38*a* are placeable by placing the top left node at the position (x, y) (S208).

In placement survey, the following criteria are set.

(1) None of the sub-DFGs placed is located outside the virtual node space illustrated in FIG. 13.

(2) All nodes of the sub-DFG newly placed have input data available to themselves.

(3) Constraints such as those imposed on input and output which are inherent in the reconfigurable circuit are not violated.

The criteria of (3) includes the constraints as illustrated in FIG. 5 permitting inputs and outputs to and from ALUs to occur only in three directions including straight up or down, immediately to the left thereof and immediately to the right thereof.

It is necessary for the sub-DFGs placed to maintain the original mutual relation in operations illustrated in FIG. 8. When the nodes can be placed properly by displacing the nodes already placed, placement survey may be carried out for all possible cases of placement so as to select the most efficient placement among the available options. The sub-DFG 38*a* has no other options for placement than being placed at (1, 1). However, when a given sub-DFG may be placed at (1, 1) or (2, 1), the joining process may be performed for each of these cases so as to select an option characterized by the fewest number of rows in the joined DFG ultimately generated.

In the placement survey, a survey is conducted to determine whether the above-mentioned criteria are met for all nodes in the sub-DFG subject to the joining process (S210). By placing the node 1 at the position (1, 1), all nodes in the sub-DFG 38*a* can be properly placed. When it is determined that all nodes can be properly placed (Yin S210), the nodes in the sub-DFG 38*a* are placed in the virtual node space (S218), thus completing the joining process on the first sub-DFG 38*b*.

A description will now be given of a procedure for the joining process on the second sub-DFG 38*b*. The node with the node ID of 7 located at the top left position in the sub-DFG 38*b* is selected (S200). Subsequently, a variable y is set to 1 (S202) and a variable x is set to 1 (S204). A determination is then made as to whether another node is already placed at the position (x, y) at which the node 7 is to be placed (S206).

In this case, the placement of the sub-DFG 38*a* is already completed so that the node 1 is already placed at the position (1, 1) (Y in S206). In this case, x=1 so that x has not reached Xmax=6 (N in S212). Therefore, x is incremented by 1 (S216) and a determination is made as to whether another node is placed at the position (2, 1) (S206). This process is repeated by incrementing x until x=6 (Y in S212). Subsequently, y is incremented by 1 (S214) and x is set to 1 again (S204). This process is repeated until a position (x, y) at which no other node is placed is found. As a result of repeating the searching process, it is found that no other node is placed at the position (6, 3) (N in S206). Subsequently, a survey is conducted to determine whether, by placing the node 7 in the DFG 38*b* at (6, 3), all other nodes in the DFG 38*b* can be properly placed (S208). In this case, all other nodes can be properly placed (Y in S210). Therefore, the sub-DFG 38*b* is placed in the virtual node space (S218), thus completing the joining process on the sub-DFG 38*b*.

A description will now be given of a procedure for the joining process on the third sub-DFG 38*c*. The node with the node ID of 21 located at the top left position in the sub-DFG 38*c* is selected (S200). Subsequently, a variable y is set to 1 (S202) and a variable x is set to 1 (S204). A determination is then made as to whether another node is already placed at the position (x, y) at which the node 21 is to be placed (S206).

In this case, the placement of the sub-DFG 38*a* and the sub-DFG 38*b* is already completed. Therefore, the search through the positions (x, y) reveals that the positions including and preceding (6, 3) are all occupied by other nodes (Y in S206). As a result of the search, it is determined that the node 21 has the possibility of being placed at the position (1, 4) (N in S206).

However, placing the node 21 at the position (1, 4) is determined to be improper since it would cause the node 27 to be placed outside the virtual node space. The inputs to the node 21 are supplied from the outputs of the nodes 15 and 17 (see FIG. 8). By placing the node 21 at (1, 4), the node 21 can be connected to the node 15 but cannot be connected to the node 17 due to the constraints imposed on input and output of ALUs. For the reasons described above, the node 21 cannot be placed at (1, 4). The node 21 cannot be placed at (2, 4), either, since it would cause the node 25 to overlap the node 14. This shows that the node 21 cannot be placed in the fourth row.

When nodes cannot be connected directly, the output data of the node is temporarily stored in the memory unit 27. In order for the output data to be input to a target ALU via the memory unit 27, at least two clock cycles is necessary, considering the time required to write to and read from the memory unit 27. As such, when the output data of the logic circuit in the reconfigurable circuit 12 is temporarily written in the memory unit 27 and read therefrom for input to a different or identical logic circuit, time delay is incurred. The operation in a single row of ALUs in the reconfigurable circuit 12 requires one clock. Therefore, the process of temporarily storing the data in the memory unit 27 and reading therefrom corresponds in processing time to two rows of ALUs.

In this example, it is ensured that the input data are available for operations at the inputs of the nodes, by placing the nodes allowing for the time required to write to and read from the memory unit 27. In this way, DFGs are processed without creating any gaps. Further, since other processes can be executed while data is waited for, the overall processing time is reduced and the processing performance is improved. This has an added advantage in that power consumption is reduced.

In this case, the node 15 and the node 17 are placed in the third row. Therefore, when it is determined that the node 21 cannot be placed in the fourth row, the node 21 should be placed in the sixth or subsequent row. As described, the position of the node of the sub-DFG newly joined is determined by spacing the position apart from the node already placed, the number of intervening rows occurring as a result of spacing being equal to or larger than the number of rows of ALUs corresponding to a time delay. As a result of searching the positions (x, y), it is determined that all nodes in the sub-DFG 38c would be placeable in the virtual node space by placing the node 21 at the position (2, 6) (Y in S210). When the placement is made, the node 25 is connected to the node 20. When data is not input by way of reading from the memory unit 27, the joining process on the sub-DFG is carried out such that the original connections between the nodes in the sub-DFGs are maintained. The sub-DFG 38c is placed accordingly in the virtual node space (S218), thus completing the joining process on the sub-DFG 38c.

A description will now be given of a procedure for the joining process on the fourth sub-DFG 38e. The node with the node ID of 41 located at the top left position in the sub-DFG 38e is selected (S200). As a result of executing step S202 and subsequent steps, it is found that the nodes 41 through 46 can be connected to nodes in the row immediately above by placing the node 41 at the position (1, 9) and that all nodes in the sub-DFG 38e would be placeable (Y in S210). The sub-DFG 38e is placed in the virtual node space (S218), thus completing the joining process on the sub-DFG 38e.

A description will now be given of a procedure for the joining process on the fifth sub-DFG 38d. The node with the node ID of 26 located at the top left position in the sub-DFG 38d is selected (S200). The node 26 needs the output data from the node 19 as the input. Accordingly, the node 26 may theoretically be placed at one of the positions (4, 4), (5, 4) and (6, 4) at which the node 26 is capable of directly receiving the output data from the node 19 subject to the constraints imposed on inputs and outputs of ALUs. Alternatively, the node 26 may theoretically be placed at a position in the sixth or subsequent row, when the input data is temporarily stored in the memory unit 27 and read therefrom. As a result of executing step S202 and subsequent steps, it is found that all nodes in the sub-DFG 38d would be placeable by placing the node 26 at the position (1, 10) (Y in S210). The sub-DFG 38d is placed accordingly in the virtual node space (S218), thus completing the joining process on the sub-DFG 38d.

Finally, a description will be given of a procedure for the joining process on the sixth sub-DFG 38f. The node with the node ID of 47 located at the top left position in the sub-DFG 38f is selected (S200). The node 47 needs the output data from the node 39 as the input. Accordingly, the node 47 may theoretically be placed at one of the positions (5, 9) and (6, 9) at which the node 47 is capable of directly receiving the output data from the node 39 subject to the constraints imposed on the relation between inputs and outputs of ALUs. Alternatively, the node 47 may theoretically be placed at a position in the eleventh or subsequent row, when the input data is temporarily stored in the memory unit 27 and read therefrom. As a result of executing step S202 and subsequent steps, it is found that the all nodes in the sub-DFG 38f would be placeable by placing the node 47 at the position (6, 11) (Y in S210). The sub-DFG 38f is placed accordingly in the virtual node space (S218), thus completing the joining process on the sub-DFG 38f.

Figure 14:
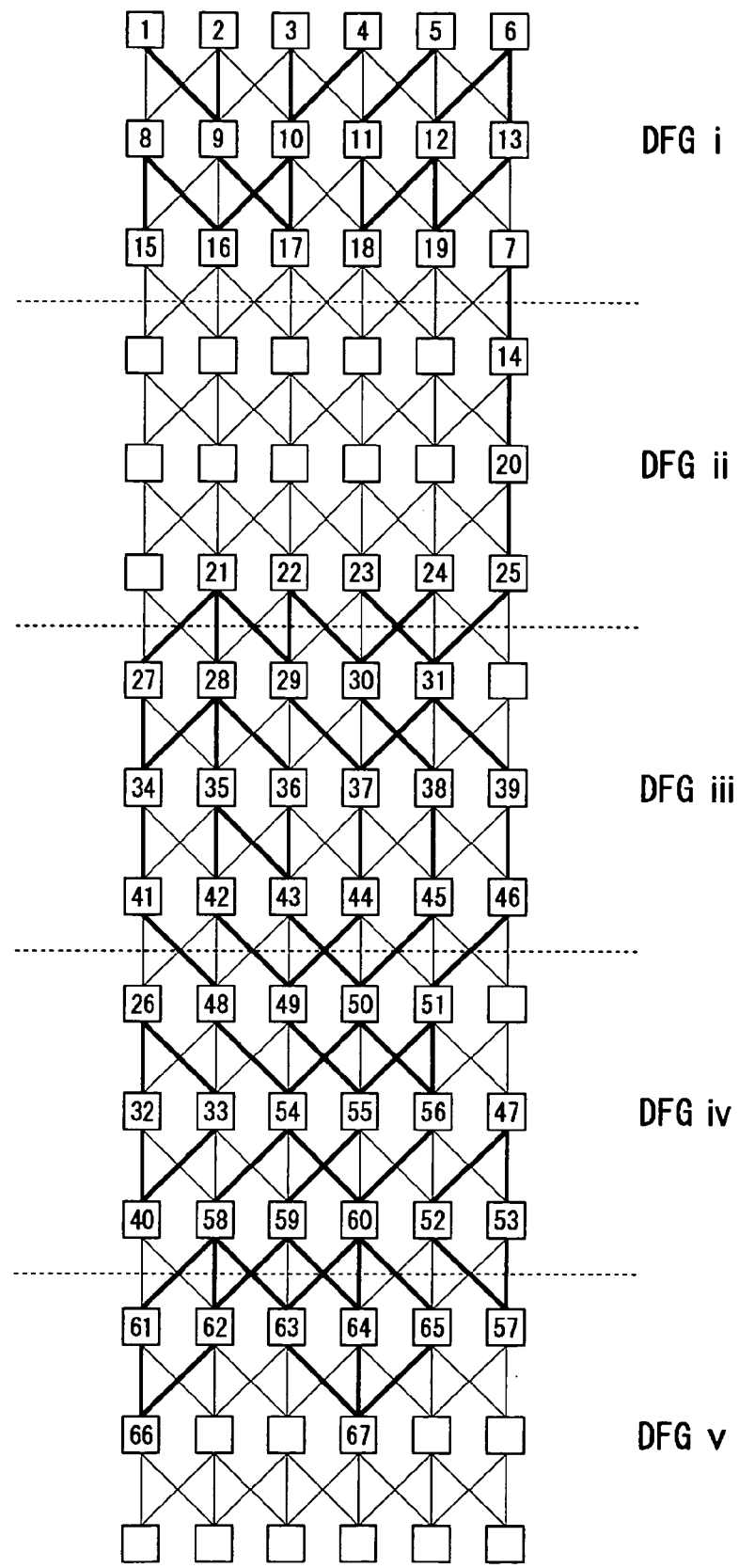
FIG. 14 illustrates a joined DFG generated by joining.

FIG. 14 illustrates a joined DFG generated by the joining process. The number of columns in the joined DFG is configured to be equal to or fewer than the number of columns in the reconfigurable circuit 12. In order to increase the efficiency in mapping into the reconfigurable circuit 12, the number of columns in the joined DFG is determined to be equal to the number of columns in the reconfigurable circuit 12.

In this example, the sub-DFGs of the DFG group 1 and those of the DFG group 2 are placed in the descending order of the number of nodes included in the sub-DFG. By placing and joining sub-DFGs with fewer number of nodes later than others, the likelihood of efficiently placing sub-DFGs with fewer number of nodes in spaces created as a result of joining sub-DFGs is increased, facilitating the reduction in the number of rows in the joined DFG. In this example, the sub-DFG 38e is placed in advance of the sub-DFG 38f. When the sub-DFG 38f is placed in advance, the position of the sub-DFG 38e is displaced downward, causing the number of rows in the joined DFG to be increased.

By minimizing the number of rows in the joined DFG as described above, the processing time is reduced so that the processing performance is improved. An added advantage is that power consumption is reduced. Since the volume of command data is also reduced, the command memory is formed to be small so that the circuit scale is reduced.

(Redivision of the Joined DFG)

Referring back to FIG. 7, the second DFG dividing unit 62 divides the joined DFG produced by the DFG joining unit 61 such that the number of rows of the divided DFG is equal to or fewer than the number of rows in the reconfigurable circuit 12. Since there are three rows of ALUs from respective columns (see FIG. 5), the joined DFG is disjoined at every third row. As illustrated in FIG. 14, the joined DFG is divided as indicated by broken lines so as to generate five subjoined DFGs ultimately. In the illustrated example, a DFG i, a DFG ii, a DFG iii, a DFG iv and a DFG v are generated. By processing the subjoined DFGs thus generated in the order occurring in the original joined DFG, data wait does not occur. Accordingly, the order of processing the sub-DFGs is automatically determined. More specifically, they are processed from top to bottom. There is no need to examine the order of processing. Data occurring between nodes across the broken line (for example, between the node 7 and the node 14) is fed back to the reconfigurable circuit 12 without the intervention of the memory unit 27. As such, no data latency is incurred in delivering data from the third row to the fourth row.

The subjoined DFGs obtained by disjoining the joined DFG into three-row blocks are stored in the storage unit 34. The configuration data generation unit 32 generates the configuration data from the subjoined DFGs. The subjoined DFGs may be supplied directly to the configuration data generation unit 32.

Described above is an explanation based on the examples. The embodiment of the present invention is only illustrative in nature and it will be obvious to those skilled in the art that various variations in constituting elements and processes are possible within the scope of the present invention.

The array of ALUs in the reconfigurable circuit 12 may not be a multiple-row array in which connection is permitted only in the vertical direction. A mesh array in which connection in the horizontal direction is also permitted may alternatively employed. In the description given so far, wiring for connecting logic circuits by skipping a row is not provided. In an alternative structure, wiring may be provided for connection in which a row is skipped over.

FIG. 1 illustrates a case where the processing apparatus 10 is provided with a single reconfigurable circuit 12. Alternatively, the processing apparatus 10 may be provided with a plurality of reconfigurable circuits 12. DFGs that can be processed in parallel are identified by generating a connectivity chart as illustrated in FIG. 10 and referring to the chart. Therefore, when there are three reconfigurable circuits 12, three DFGs in the second row can be processed simultaneously. In this way, the data processing time is reduced.

The example disclosed should be construed as being only illustrative and non-limiting in all respects. The present invention, represented not by the description given but by the scope of the appended claims, is intended to encompass modifications that are within the meaning and scope equivalent to that covered by the appended claims.

What is claimed is:

1. A data flow graph processing method for processing a data flow graph necessary to configure the operation of a reconfigurable circuit provided with a plurality of sets of logic circuits with variable functions, comprising:
    a first dividing step of dividing the data flow graph into a plurality of sub-data flow graphs when the data flow graph does not accord with the number of logic circuits in the sets of the reconfigurable circuit;
    a joining step of joining a sub-data flow graph between other sub-data flow graphs or joining the sub-data flow graph neighboring to other sub-data flow graphs; and
    generating a configuration data for mapping a joined data flow graph which accords with the number of logic circuits,
    wherein the data flow graph includes nodes each representing a function of the logic circuit, and
    the joining step joins the plurality of sub-data flow graphs such that connections between the nodes in the divided sub-data flow graphs are maintained.

* * * * *